(12) United States Patent
Chen

(10) Patent No.: US 12,547,196 B2
(45) Date of Patent: Feb. 10, 2026

(54) COMPENSATION CIRCUIT OF REALIZING EQUIVALENT CAPACITANCE AMPLIFICATION

(71) Applicant: ANPEC ELECTRONICS CORPORATION, Hsinchu (TW)

(72) Inventor: Fu-Chuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 225 days.

(21) Appl. No.: 18/616,925

(22) Filed: Mar. 26, 2024

(65) Prior Publication Data

US 2025/0224749 A1 Jul. 10, 2025

(30) Foreign Application Priority Data

Jan. 10, 2024 (TW) .................................. 113100997

(51) Int. Cl.
| | | |
|---|---|---|
| G05F 1/575 | (2006.01) | |
| G05F 1/565 | (2006.01) | |
| H03F 1/02 | (2006.01) | |
| H03F 1/08 | (2006.01) | |
| H03F 1/34 | (2006.01) | |

(52) U.S. Cl.
CPC .............. *G05F 1/575* (2013.01); *G05F 1/565* (2013.01); *H03F 1/02* (2013.01); *H03F 1/08* (2013.01); *H03F 1/34* (2013.01)

(58) Field of Classification Search
CPC . G05F 1/565; G05F 1/575; H03F 1/02; H03F 1/08; H03F 1/34
See application file for complete search history.

(56) References Cited

U.S. PATENT DOCUMENTS

| | | | | |
|---|---|---|---|---|
| 5,315,266 A | * | 5/1994 | Lorenz | H03F 3/3071 330/255 |
| 6,359,510 B1 | * | 3/2002 | Ishii | H03F 3/45991 330/253 |
| 7,518,428 B2 | * | 4/2009 | Ichiba | H02M 3/156 327/552 |
| 7,564,306 B2 | * | 7/2009 | Lee | H03F 3/45946 330/258 |

(Continued)

FOREIGN PATENT DOCUMENTS

| | | |
|---|---|---|
| TW | 201534028 A | 9/2015 |
| TW | 202025623 A | 7/2020 |

*Primary Examiner* — Yusef A Ahmed
(74) *Attorney, Agent, or Firm* — Li & Cai Intellectual Property (USA) Office

(57) ABSTRACT

A compensation circuit of realizing equivalent capacitance amplification is provided. The compensation circuit includes an error amplifier, a resistor and a capacitor. A first terminal of the resistor is connected to a first output terminal of the error amplifier. A second terminal of the resistor is connected to a second output terminal of the error amplifier and the capacitor. An amplified error current signal outputted from the first output terminal of the error amplifier flows through the resistor, and is then divided into a capacitor charging signal and an error amplified reverse current signal. The capacitor charging signal flows to the capacitor. The error amplified reverse current signal flows through the second output terminal of the error amplifier into the error amplifier. The error amplified reverse current signal is larger than the capacitor charging signal.

9 Claims, 5 Drawing Sheets

(56) References Cited

U.S. PATENT DOCUMENTS

| | | | | |
|---|---|---|---|---|
| 8,519,695 | B2* | 8/2013 | Ito | H03F 3/45475 |
| | | | | 323/314 |
| 9,287,774 | B2* | 3/2016 | Chen | H02M 3/156 |
| 9,319,004 | B2* | 4/2016 | Bandyopadhyay | H03F 1/34 |
| 10,469,037 | B2* | 11/2019 | Wen | H03F 3/21 |
| 10,924,099 | B2* | 2/2021 | Wang | H03K 5/2472 |
| 2007/0273414 | A1* | 11/2007 | Jung | H02M 3/156 |
| | | | | 327/113 |
| 2007/0285173 | A1* | 12/2007 | Jung | H02M 3/156 |
| | | | | 330/302 |
| 2007/0286611 | A1* | 12/2007 | Weber | H04B 10/693 |
| | | | | 398/202 |
| 2013/0250620 | A1* | 9/2013 | Huang | H02M 1/4225 |
| | | | | 363/15 |
| 2015/0229274 | A1* | 8/2015 | Cho | H03F 3/45941 |
| | | | | 330/260 |
| 2015/0237690 | A1* | 8/2015 | Lin | H05B 45/38 |
| | | | | 315/224 |
| 2017/0170795 | A1* | 6/2017 | Garbarino | H03F 3/45179 |
| 2017/0207760 | A1* | 7/2017 | Werking | G01P 15/125 |
| 2019/0238093 | A1* | 8/2019 | Hsieh | H03B 5/1206 |
| 2019/0252890 | A1* | 8/2019 | Chen | H02J 7/00712 |
| 2021/0397207 | A1* | 12/2021 | Joo | H02M 1/08 |
| 2022/0206519 | A1* | 6/2022 | Zhong | G05F 1/461 |
| 2022/0206521 | A1* | 6/2022 | Choi | G05F 1/575 |
| 2023/0400872 | A1* | 12/2023 | Zhou | G05F 1/465 |
| 2024/0319756 | A1* | 9/2024 | Xie | G05F 1/575 |
| 2024/0361793 | A1* | 10/2024 | Huang | G05F 1/565 |
| 2025/0192741 | A1* | 6/2025 | Hayakawa | H03F 1/34 |

* cited by examiner

COMPENSATION CIRCUIT OF REALIZING EQUIVALENT CAPACITANCE AMPLIFICATION

CROSS-REFERENCE TO RELATED PATENT APPLICATION

This application claims the benefit of priority to Taiwan Patent Application No. 113100997, filed on Jan. 10, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a capacitor, and more particularly to a compensation circuit of realizing equivalent capacitance amplification.

BACKGROUND OF THE DISCLOSURE

In recent years, with the advancement of science and technology, electronic products having various functions have been gradually developed to satisfy various needs. The electronic products are integrated into people's everyday lives to make their lives more convenient. These electronic products include various electronic components that require different power supply voltages. Therefore, a power converter is used to convert input voltages into appropriate voltages and supplies the appropriate voltages to the electronic components of the electronic products, such that the electronic components can operate normally.

In the power converter, an error amplifier is an indispensable part of a feedback circuit for compensation. The error amplifier compares the feedback voltage (that is a voltage divided from an output voltage of the power converter) from an output terminal of the power converter with the reference voltage to output an error amplified current signal for maintaining the output voltage of the power converter to be at a target voltage value. A load transient response of the power converter is affected by a response efficiency of the error amplifier.

SUMMARY OF THE DISCLOSURE

In response to the above-referenced technical inadequacies, the present disclosure provides a compensation circuit of realizing equivalent capacitance amplification. The compensation circuit includes an error amplifier, a resistor and a capacitor. A first input terminal of the error amplifier is coupled with a reference voltage. A second input terminal of the error amplifier is coupled with a feedback voltage. A first terminal of the resistor is connected to a first output terminal of the error amplifier. A second terminal of the resistor is connected to a second output terminal of the error amplifier. A first terminal of the capacitor is connected to the second terminal of the resistor. A second terminal of the capacitor is grounded. An amplified error current signal outputted from the first output terminal of the error amplifier flows through the resistor, and is then divided into a capacitor charging signal and an error amplified reverse current signal. The capacitor charging signal flows to the capacitor. The error amplified reverse current signal flows through the second output terminal of the error amplifier into the error amplifier. The error amplified reverse current signal is larger than the capacitor charging signal.

As described above, the present disclosure provides the compensation circuit of realizing the equivalent capacitance amplification. Therefore, only the capacitor having the small capacitance needs to be included in the compensation circuit of the present disclosure, thereby saving cost and an area occupied by the capacitor. Under this condition, the effect realized by the large capacitance of the capacitor having the large size is still achieved by the compensation circuit of the present disclosure. In some applications, by the compensation circuit of the present disclosure, the equivalent amplification effect of the capacitance of the capacitor is attenuated for reducing the equivalent capacitance of the capacitor such that the response speed of the capacitor is increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
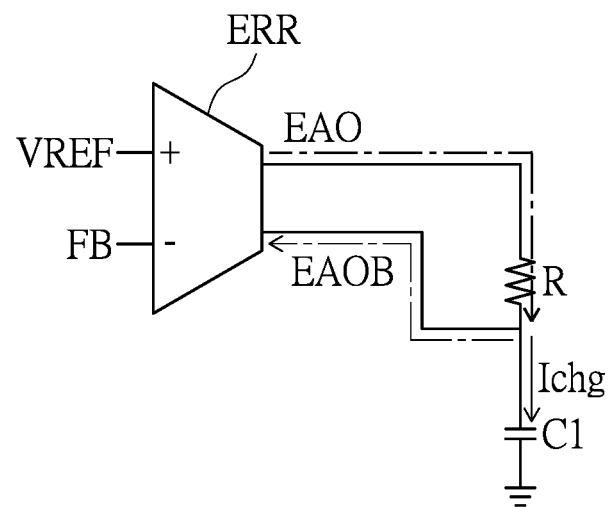
FIG. 1 is a circuit diagram of a compensation circuit of realizing equivalent capacitance amplification according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit diagram of a compensation circuit of realizing equivalent capacitance amplification according to a first embodiment of the present disclosure.

As shown in FIG. 1, the compensation circuit of the present disclosure includes an error amplifier ERR, a resistor R and a capacitor C1.

A first input terminal such as a non-inverting input terminal of the error amplifier ERR is coupled with a reference voltage VREF. A second input terminal such as an inverting input terminal of the error amplifier ERR is coupled with a feedback voltage FB.

A first terminal of the resistor R is connected to a first output terminal of the error amplifier ERR. A second terminal of the resistor R is connected to a second output terminal of the error amplifier ERR.

A first terminal of the capacitor C1 is connected to a second terminal of the resistor R. A second terminal of the capacitor C1 is grounded.

The error amplifier ERR of the first embodiment of the present disclosure is an operational transconductance amplifier (OTA). A current value of an amplified error current signal EAO of the error amplifier ERR is calculated by the following equation: I(EAO)=N×gm×(VREF−FB), wherein I(EAO) represents the current value of the amplified error current signal EAO, VREF represents the reference voltage, and FB represents the feedback voltage.

A current value of an error amplified reverse current signal EAOB of the error amplifier ERR is calculated by the following equation: I(EAOB)=−(N−1)×gm×(VREF−FB), wherein I(EAOB) represents the current value of the error amplified reverse current signal EAOB, and a negative sign represents a flow direction of the error amplified reverse current signal EAOB that is opposite to a flow direction of the amplified error current signal EAO.

If the amplified error current signal EAO flows out of the error amplifier ERR, the error amplified reverse current signal EAOB flows into the error amplifier ERR. Conversely, if the amplified error current signal EAO flows into the error amplifier ERR, the error amplified reverse current signal EAOB flows out the error amplifier ERR.

For example, as shown in FIG. 1, the amplified error current signal EAO outputted from the first output terminal of the error amplifier ERR flows through the resistor R, and then is divided into a capacitor charging signal Ichg and the error amplified reverse current signal EAOB. Then, the capacitor charging signal Ichg flows to the capacitor C1, and the error amplified reverse current signal EAOB flows through the second output terminal of the error amplifier ERR into the error amplifier ERR.

Equations for amplification of a capacitance of the capacitor C1 are described follows. The current value of the amplified error current signal EAO is calculated by the following equation: N×gm×(VREF−FB). When the amplified error current signal EAO flows through the resistor R, a value of a current that losses from the amplified error current signal EAO is calculated by the following equation: (N−1)×gm×(VREF−FB). Therefore, a remaining current value of the amplified error current signal EAO is calculated by the following equation: Ichg=N×gm×(VREF−FB)−(N−1)×gm×(VREF−FB)=gm×(VREF−FB).

A variation in a voltage of the capacitor C1 is calculated by the following equation:

$$dVc1/dt = Ichg/C1 = gm\times(VREF-FB)/C1,$$

wherein dVc1 represents the variation in the voltage of the capacitor C1, dt represents a time variation, Ichg represents the current flowing through the capacitor C1, VREF represents the reference voltage, FB represents the feedback voltage, and C1 represents the capacitor.

A variation in a voltage slope of the amplified error current signal EAO is equal to a variation in a voltage slope of a voltage signal of the capacitor C1, which is calculated by the following equation:

$$dVeao/dt = gm\times(VREF-FB)/C1,$$

wherein dVeao/dt represents the variation in the voltage slope of the amplified error current signal EAO.

The capacitance of the capacitor C1 is calculated by the following equation: C=I/(dV/dt). An equivalently amplified capacitance equation is derived for calculating an equivalently amplified capacitance of the capacitor C1 as follows:

$$Ceao = N\times gm\times(VREF-FB)/[gm\times(VREF-FB)/C1] = N\times C1,$$

wherein Ceao represents the equivalently amplified capacitance of the capacitor C1.

As described above, the compensation circuit of the present disclosure equivalently amplifies the capacitance of the capacitor C1 by N times, wherein N is any appropriate value.

Therefore, only the capacitor C1 having the small capacitance needs to be included in the compensation circuit of the present disclosure, thereby saving cost and an area occupied by the capacitor C1. Under this condition, an effect realized by a large capacitance of a capacitor having a large size is still achieved by the compensation circuit of the present disclosure.

Figure 4:
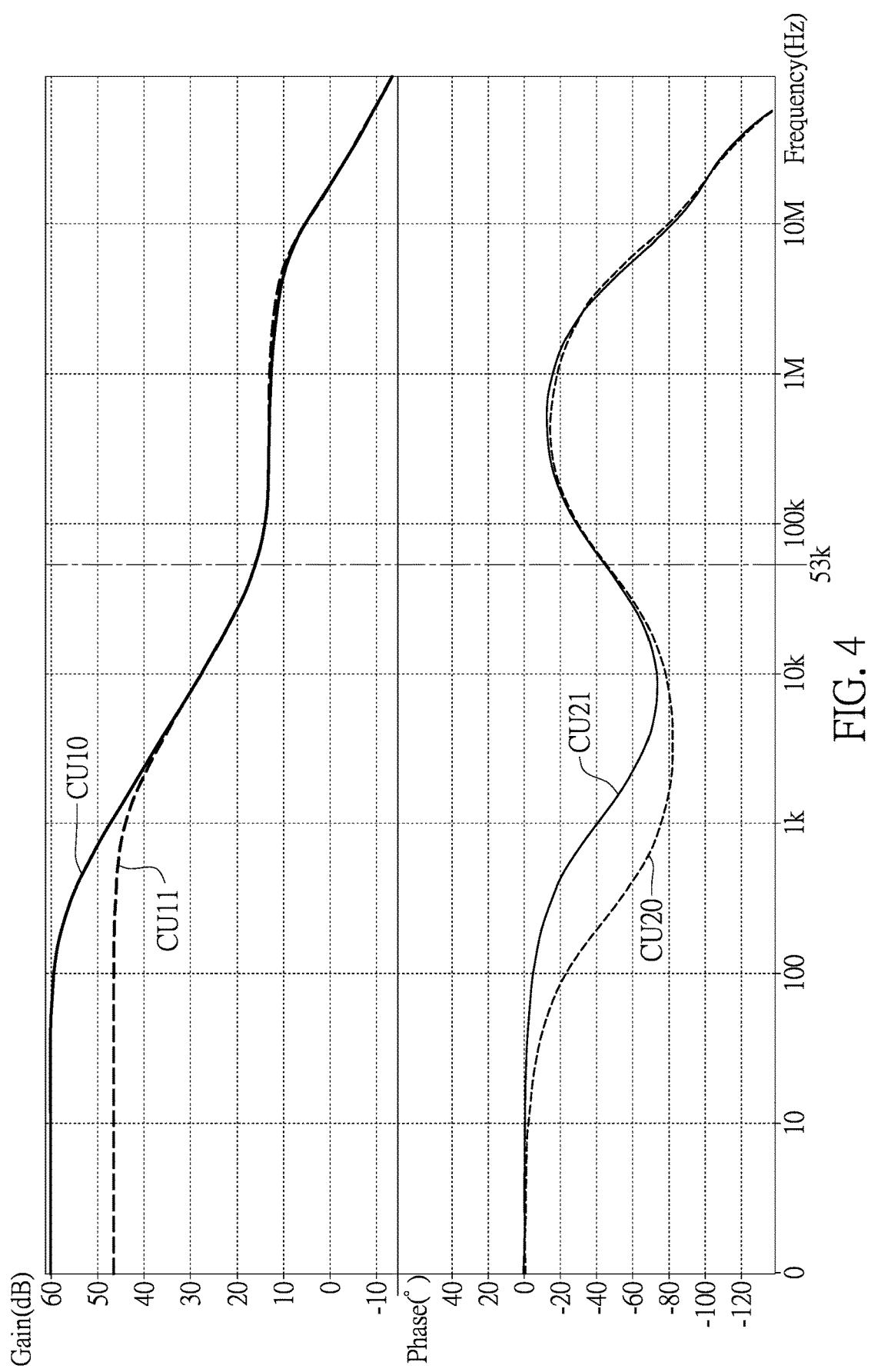
FIG. 4 is a waveform diagram of signals of the compensation circuit of the first to third embodiments of the present disclosure and a conventional compensation circuit.

Reference is made to FIG. 1 and FIG. 4, in which FIG. 4 is a waveform diagram of signals of the compensation circuit of the first to third embodiments of the present disclosure and a conventional compensation circuit.

In an example of FIG. 4, both of a resistance of the resistor R of the present disclosure and a resistance of a resistor of the conventional compensation circuit are 100 Kohm.

As shown in FIG. 1, the error amplified reverse current signal EAOB is generated by the compensation circuit of the present disclosure. In the example of FIG. 4, a ratio of the current value of the error amplified reverse current signal EAOB to the current value of the amplified error current signal EAO is 3:2, and the capacitance of the capacitor C1 included in the compensation circuit of the present disclosure is only 10 pF. In contrast, no error amplified reverse current signal is generated by the conventional compensation circuit, and a capacitor included in the conventional compensation circuit having a larger capacitance of 30 pF.

The capacitance of the capacitor C1 of the compensation circuit of the present disclosure is only one third of the capacitance of the capacitor of the conventional compensation circuit. Under this condition, as shown in FIG. 4, a frequency response curve CU11 of the compensation circuit of the present disclosure reaches same gains including a zero gain value as a frequency response curve CU10 of the conventional compensation circuit. The frequency response curve CU11 and the frequency response curve CU10 are overlapped with each other at frequencies such as about 53 kHz, which is calculated by the following equation: $1/(2\pi \times R \times C)$.

As shown in FIG. 4, a frequency response curve CU21 of the compensation circuit of the present disclosure reaches same phases including a zero phase value as a frequency response curve CU20 of the conventional compensation circuit. The frequency response curve CU21 and the frequency response curve CU20 are overlapped with each other at frequencies such as about 53 kHz that is calculated by the following equation: $1/(2\pi \times R \times C)$.

According to above, in the example of FIG. 4, the capacitance of the capacitor C1 is equivalently amplified three times. It is apparent that, an equivalent amplification effect of the capacitance of the capacitor C1 is realized by the compensation circuit of the present disclosure.

Figure 2:
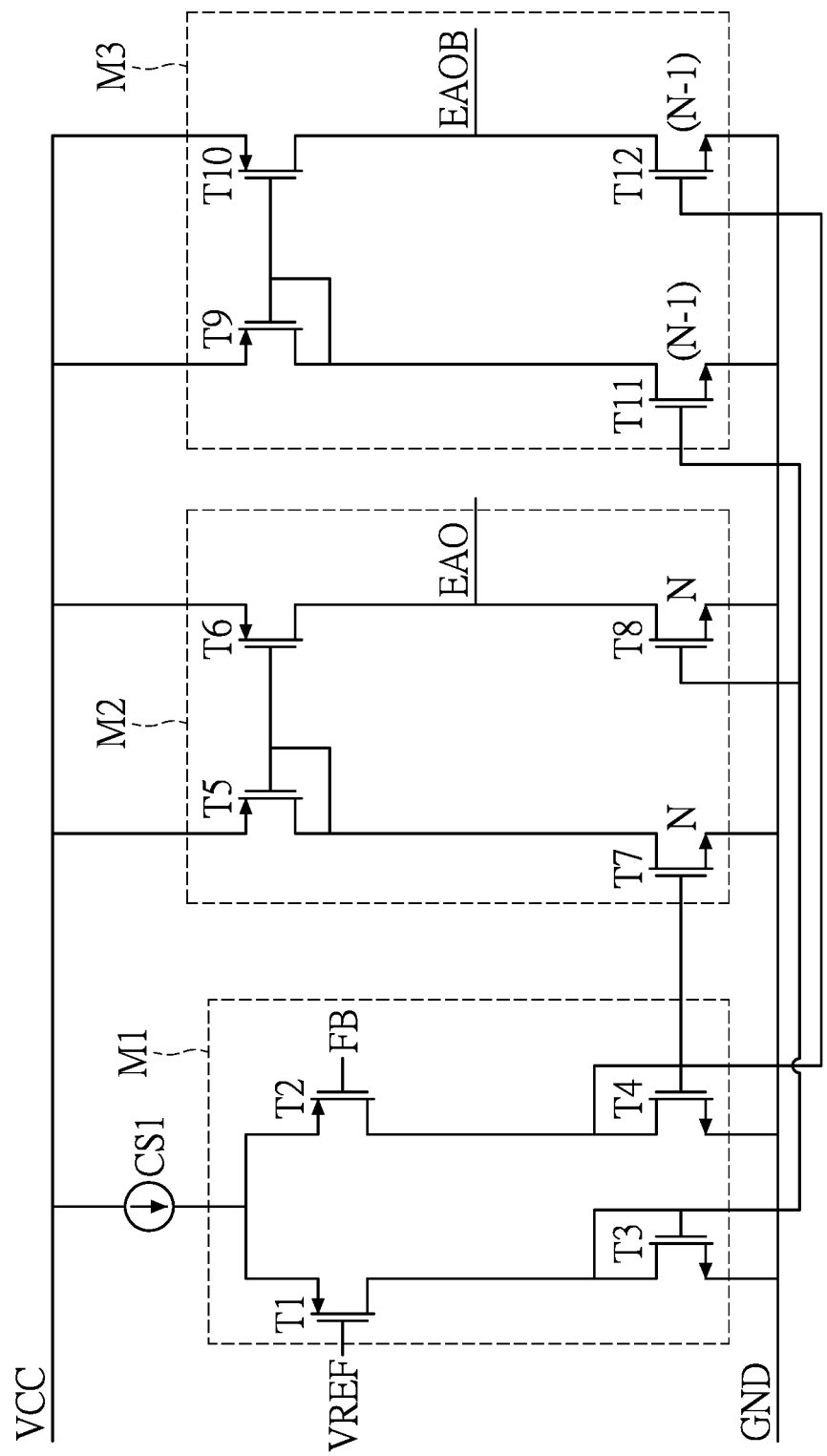
FIG. 2 is a circuit diagram of an error amplifier circuit inside an error amplifier of a compensation circuit of realizing equivalent capacitance amplification according to a second embodiment of the present disclosure.

Reference is made to FIG. 2, which is a circuit diagram of an error amplifier circuit inside an error amplifier of a compensation circuit of realizing equivalent capacitance amplification according to a second embodiment of the present disclosure.

In the second embodiment, an error amplifier circuit inside an error amplifier (such as the error amplifier ERR shown in FIG. 1) of the compensation circuit of the present disclosure includes a first voltage input circuit M1, a first amplified error output circuit M2 and a second amplified error output circuit M3 as shown in FIG. 2.

The first voltage input circuit M1 includes a first current source CS1, a first transistor T1, a second transistor T2, a third transistor T3 and a fourth transistor T4.

An input terminal of the first current source CS1 is coupled with a common voltage VCC.

A first terminal of the first transistor T1 is connected to an output terminal of the first current source CS1. A control terminal of the first transistor T1 is one of a plurality of input terminals of the first voltage input circuit M1. The control terminal of the first transistor T1 is used as the first input terminal such as the non-inverting input terminal of the error amplifier ERR and is coupled with the reference voltage VREF.

A first terminal of the second transistor T2 is connected to the output terminal of the first current source CS1. A control terminal of the second transistor T2 is another of the plurality of input terminals of the first voltage input circuit M1. The control terminal of the second transistor T2 is used as the second input terminal such as the inverting input terminal of the error amplifier ERR and is coupled with the feedback voltage FB.

A first terminal of the third transistor T3 is connected to a second terminal of the first transistor T1 and a control terminal of the third transistor T3. A second terminal of the third transistor T3 is connected to a ground GND.

A first terminal of the fourth transistor T4 is connected to a control terminal of the fourth transistor T4 and a second terminal of the second transistor T2. A second terminal of the fourth transistor T4 is connected to the ground GND.

The first amplified error output circuit M2 includes a fifth transistor T5, a sixth transistor T6, a seventh transistor T7 and an eighth transistor T8.

A first terminal of the fifth transistor T5 is coupled with the common voltage VCC.

A first terminal of the sixth transistor T6 is coupled with the common voltage VCC. A control terminal of the sixth transistor T6 is connected to a control terminal and a second terminal of the fifth transistor T5.

A first terminal of the seventh transistor T7 is connected to the second terminal of the fifth transistor T5. A control terminal of the seventh transistor T7 is connected to the control terminal and the first terminal of the fourth transistor T4. A second terminal of the seventh transistor T7 is connected to the ground GND.

A first terminal of the eighth transistor T8 is connected to a second terminal of the sixth transistor T6. A control terminal of the eighth transistor T8 is connected to the control terminal and the first terminal of the third transistor T3. A second terminal of the eighth transistor T8 is connected to the ground GND. A node between the first terminal of the eighth transistor T8 and the first terminal of the sixth transistor T6 is an output terminal of the first amplified error output circuit M2. The output terminal of the first amplified error output circuit M2 is used as the first output terminal of the error amplifier ERR. The amplified error current signal EAO is outputted from the first output terminal of the error amplifier ERR.

The first amplified error output circuit M2 amplifies a value of an input error signal from the first voltage input circuit M1 by N times to output the amplified error current signal EAO (that is a current signal at the first terminal of the eighth transistor T8) to outside of the error amplifier ERR through the first output terminal of the error amplifier ERR, wherein the N in "N times" is an integer value being larger than 1.

That is, in the second embodiment, a ratio of a current at the first terminal of the fourth transistor T4 to a current at the first terminal of the seventh transistor T7 is 1:N, a ratio of a current at the first terminal of the third transistor T3 to a current at the first terminal of the eighth transistor T8 is 1:N, and a ratio of a the current at the first terminal of the eighth transistor T8 to the current at the first terminal of the seventh transistor T7 is 1:1, but the present disclosure is not limited thereto.

The second amplified error output circuit M3 includes a ninth transistor T9, a tenth transistor T10, an eleventh transistor T11 and a twelfth transistor T12.

A first terminal of the ninth transistor T9 is coupled with the common voltage VCC.

A first terminal of the tenth transistor T10 is coupled with the common voltage VCC. A control terminal of the tenth transistor T10 is connected to a control terminal and a second terminal of the ninth transistor T9.

A first terminal of the eleventh transistor T11 is connected to the second terminal of the ninth transistor T9. A second terminal of the eleventh transistor T11 is connected to the ground GND. A control terminal of the eleventh transistor T11 is connected to the first terminal and the control terminal of the third transistor T3.

A first terminal of the twelfth transistor T12 is connected to a second terminal of the tenth transistor T10. A second terminal of the twelfth transistor T12 is connected to the ground GND. A control terminal of the twelfth transistor T12 is connected to the first terminal and the control terminal of the fourth transistor T4. A node between the first terminal of the twelfth transistor T12 and the second terminal of the tenth transistor T10 is an output terminal of the second amplified error output circuit M3. The output terminal of the second amplified error output circuit M3 is used as the second output terminal of the error amplifier ERR. The error amplified reverse current signal EAOB is outputted from the second output terminal of the error amplifier ERR.

The second amplified error output circuit M3 amplifies the input error signal by (N−1) times to output the error amplified reverse current signal EAOB (that is a current signal at the first terminal of the twelfth transistor T12) to outside of the error amplifier ERR through the second output terminal of the error amplifier ERR, wherein the N in "N times" is an integer value being larger than 1.

That is, in the second embodiment, a ratio of the current at the first terminal of the third transistor T3 to a current at the first terminal of the eleventh transistor T11 is 1:(N−1), a ratio of the current at the first terminal of the fourth transistor T4 to a current at the first terminal of the eleventh transistor T11 is 1:(N−1), and a ratio of the current at the first terminal of the eleventh transistor T11 to a current at the first terminal of the twelfth transistor T12 is 1:1, but the present disclosure is not limited thereto.

Figure 3:
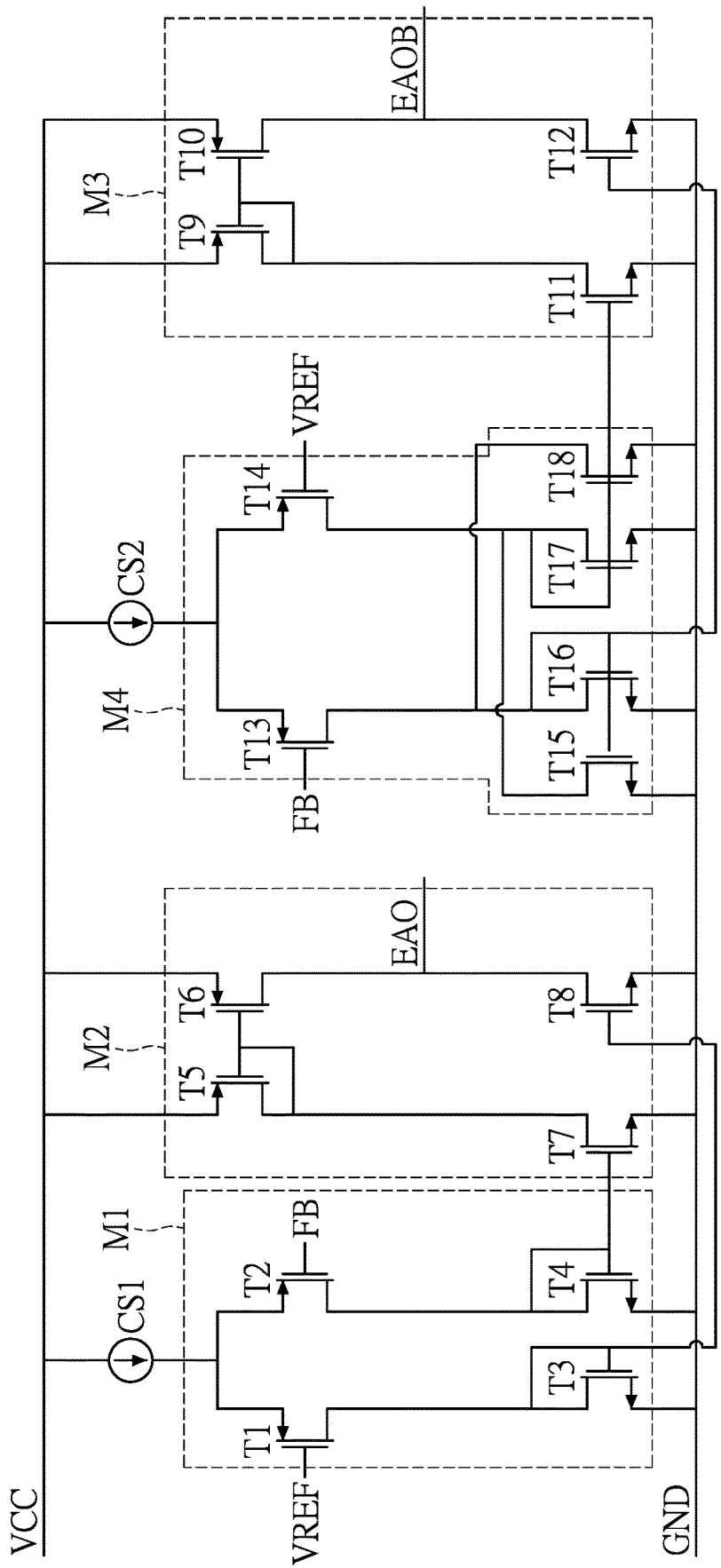
FIG. 3 is a circuit diagram of an error amplifier circuit inside an error amplifier of a compensation circuit of realizing equivalent capacitance amplification according to a third embodiment of the present disclosure.
Figure 5:
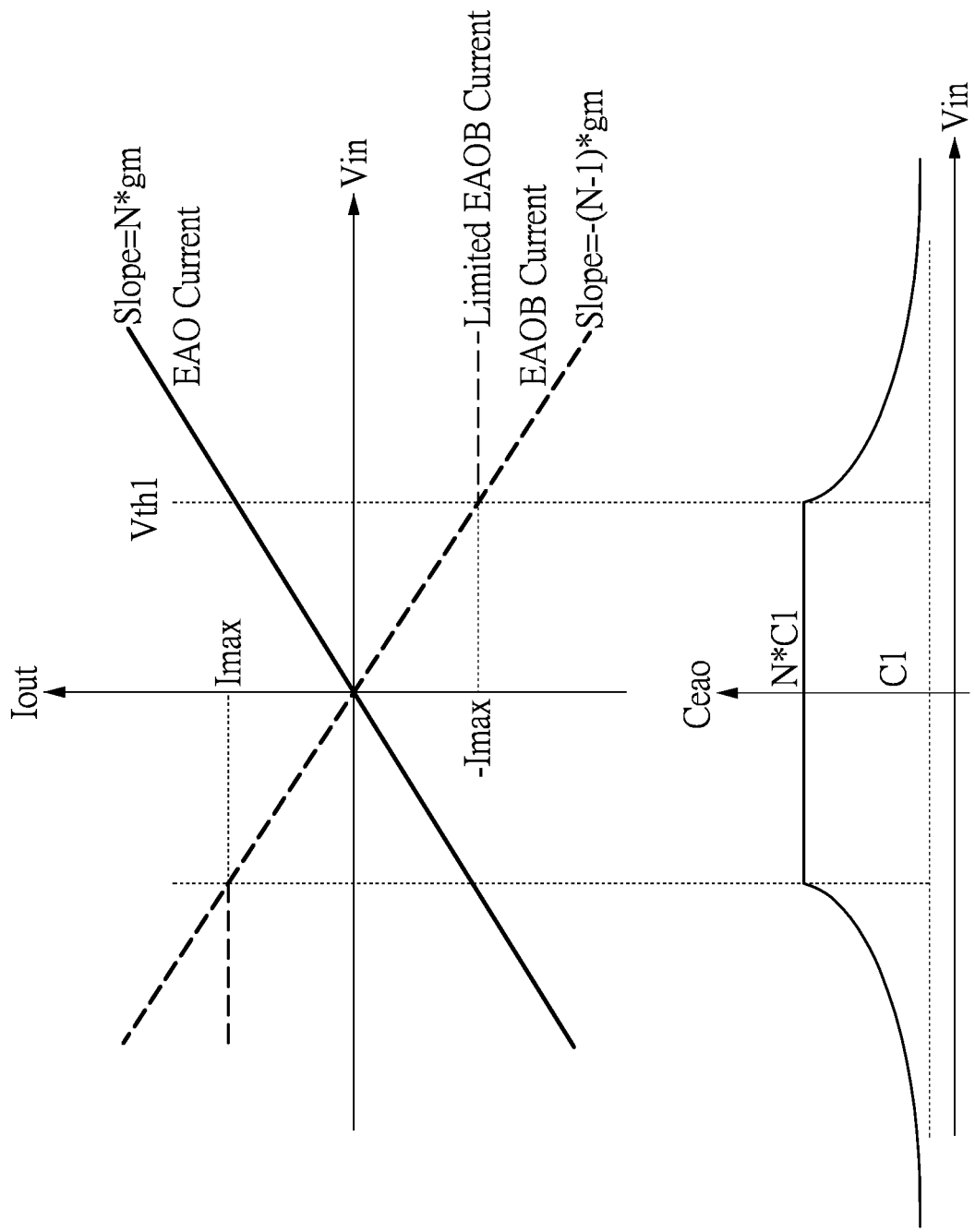
FIG. 5 is a schematic diagram of a relationship between an equivalently amplified capacitance and an input voltage (being equal to a reference voltage subtracted from a feedback voltage) of the compensation circuit of realizing equivalent capacitance amplification according to the third embodiment of the present disclosure.

Reference is made to FIG. 3 and FIG. 5, in which FIG. 3 is a circuit diagram of an error amplifier circuit inside an error amplifier of a compensation circuit of realizing equivalent capacitance amplification according to a third embodiment of the present disclosure, and FIG. 5 is a schematic diagram of a relationship between an equivalently amplified capacitance and an input voltage (being equal to a reference voltage subtracted from a feedback voltage) of the compensation circuit of realizing equivalent capacitance amplification according to the third embodiment of the present disclosure.

In the third embodiment, an error amplifier circuit inside an error amplifier (such as the error amplifier ERR shown in FIG. 1) of the compensation circuit of the present disclosure not only includes the first voltage input circuit M1, the first amplified error output circuit M2 and the second amplified error output circuit M3 as shown in FIG. 3, but also includes a second voltage input circuit M4 as shown in FIG. 3.

The configurations and the operations of the first voltage input circuit M1, the first amplified error output circuit M2 and the second amplified error output circuit M3 are described above.

As shown in FIG. 3, the second voltage input circuit M4 includes a second current source CS2, a thirteenth transistor T13, a fourteenth transistor T14, a fifteenth transistor T15, a sixteenth transistor T16, a seventeenth transistor T17 and an eighteenth transistor T18.

An input terminal of the second current source CS2 is coupled with the common voltage VCC.

A first terminal of the thirteenth transistor T13 is connected to an output terminal of the second current source CS2. A control terminal of the thirteenth transistor T13 is coupled with the feedback voltage FB.

A first terminal of the fourteenth transistor T14 is connected to the output terminal of the second current source CS2. A control terminal of the fourteenth transistor T14 is coupled with the reference voltage VREF.

A first terminal of the fifteenth transistor T15 is connected to a second terminal of the fourteenth transistor T14. A second terminal of the fifteenth transistor T15 is connected to the ground GND.

A first terminal of the sixteenth transistor T16 is connected to a second terminal of the thirteenth transistor T13. A second terminal of the sixteenth transistor T16 is connected to the ground GND. A control terminal of the sixteenth transistor T16 is connected to the first terminal of the sixteenth transistor T16, a control terminal of the fifteenth transistor T15 and the control terminal of the twelfth transistor T12.

A first terminal of the seventeenth transistor T17 is connected to the second terminal of the fourteenth transistor T14 and a control terminal of the seventeenth transistor T17. A second terminal of the seventeenth transistor T17 is connected to the ground GND.

A first terminal of the eighteenth transistor T18 is connected to the second terminal of the thirteenth transistor T13. A control terminal of the eighteenth transistor T18 is connected to the control terminal of the seventeenth transistor T17 and the control terminal of the eleventh transistor T11. A second terminal of the eighteenth transistor T18 is connected to the ground GND.

It is worth noting that, a current outputted from the output terminal of the second current source CS2 is smaller than a current outputted from the output terminal of the first current source CS1.

Ratio relationships between the fifteenth transistor T15, the sixteenth transistor T16, the seventeenth transistor T17 and the eighteenth transistor T18 are represented by: T16=T17>T15=T18.

A node between the first terminal of the eighth transistor T8 and the second terminal of the sixth transistor T6 in the first voltage input circuit M1 is used as the first output terminal of the error amplifier ERR. The amplified error current signal EAO as shown in FIG. 5 is outputted from the first output terminal of the error amplifier ERR. As shown in FIG. 5, a current slope of the amplified error current signal EAO is calculated by the following equation: SLEAO=N×gm, wherein SLEAO represents the current slope of the amplified error current signal EAO.

A node between the first terminal of the twelfth transistor T12 and the second terminal of the tenth transistor T10 in the second amplified error output circuit M3 is used as the second output terminal of the error amplifier ERR. The error amplified reverse current signal EAOB is outputted from the second output terminal of the error amplifier ERR. A relationship between an output current Iout and an input voltage Vin (being equal to the reference voltage VREF subtracted from the feedback voltage FB) of the error amplifier ERR is shown in FIG. 5. A current slope of the error amplified reverse current signal EAOB is calculated by the following equation: SLEAOB=−(N−1)×gm, wherein SLEAOB represents the current slope of the error amplified reverse current signal EAOB, and gm represents a transconductance of an input stage of the error amplifier ERR.

When the input voltage Vin (being equal to the reference voltage VREF subtracted from the feedback voltage FB) is a zero value, a current flowing through the first transistor T1 is equal to a current flowing through the second transistor T2. At this time, a current flowing through the sixth transistor T6 is equal to a current flowing through the eighth transistor T8 (that is represented by I(T6)−I(T8)) such that the current of the amplified error current signal EAO is a zero value.

Conversely, when the input voltage Vin (being equal to the reference voltage VREF subtracted from the feedback voltage FB) is not the zero value, the current flowing through the first transistor T1 is not equal to the current flowing through the second transistor T2. As a result, the current of the amplified error current signal EAO is larger than the zero value, and the current of the amplified error current signal EAO increases with an increase in the input voltage Vin.

The input voltage Vin is a voltage difference between the reference voltage VREF and the feedback voltage FB that are received by the error amplifier ERR. When the voltage difference between the reference voltage VREF and the feedback voltage FB is too large, the equivalent amplification effect of the capacitance of the capacitor C1 is attenuated for reducing the equivalent capacitance Ceao of the capacitor C1. The smaller the equivalent capacitance Ceao is, the faster the response speed of the capacitor C1 is.

In order to attenuate the equivalent amplification effect of the capacitance of the capacitor C1, the current supplied by the second current source CS2 is smaller than the current supplied by the first current source CS1. When the input voltage Vin (being equal to the reference voltage VREF subtracted from the feedback voltage FB) reaches a voltage threshold Vth1, the current supplied by the second current source CS2 fully flows through the thirteenth transistor T13, and no current flows through the fourteenth transistor T14.

Further, when the input voltage Vin (being equal to the reference voltage VREF subtracted from the feedback voltage FB) exceeds the voltage threshold Vth1, the current of the second current source CS2 continually flows through the thirteenth transistor T13, and no current flows through the fourteenth transistor T14. As a result, the current value of the error amplified reverse current signal EAOB is not further changed, which is marked by a horizontal straight line representing the error amplified reverse current signal EAOB as shown in FIG. 5.

When the currents are not limited (Vin<Vth1), the following equations are performed:

$I(EAO) = N \times gm \times Vin$, wherein $Vin = VREF - FB$;

$I(EAOB) = -(N-1) \times gm \times Vin$;

$Ichg = N \times gm \times Vin - (N-1) \times gm \times Vin = gm \times Vin$;

$dVc1/dt = Ichg/C1 = gm \times Vin/C1$;

$dVeao/dt = dVc1/dt = gm \times Vin/C1$; and $Ceao = I(EAO)/(dVeao/dt) = N \times gm \times Vin/(gm \times Vin/C1) = N \times C1$;

wherein I(EAO) represents the current value of the error amplified reverse current signal, Vin represents the input voltage, FB represents the feedback voltage FB, Ichg represents a current flowing through the capacitor C1, I(EAOB) represents the current value of the error amplified reverse current signal EAOB, dVc1 represents a variation in the voltage of the capacitor C1, dt represents a time variation, and dVeao/dt represents the voltage slope of the amplified error current signal EAO.

When the currents are limited (Vin>Vth1), the following equations are performed for calculating the equivalent capacitance of the capacitor C1 when the input voltage Vin is equal to KxVth1:

$I(EAOB) = -Imas$, $Imas = -(N-1) \times gm \times Vth1$, $Vin = VREF - FB = K \times Vth1$, $I(EAOB) = -Imax = -(N-1) \times gm \times Vth1 = -(N-1) \times gm \times Vin/K$, $Ichg = N \times gm \times Vin - (N-1) \times gm \times Vin/K = gm \times Vin \times [N-(N-1)/K)]$, $dVeao/dt = N \times gm \times Vin/[gm \times Vin \times (N-(N-1)/K)] \times C1 = C1 \times N \times K/(N \times K - N + 1)$, if $K=1 \Rightarrow Ceao = N \times C1$, if $K=2 \Rightarrow Ceao = 2 \times N/(N+1) \times C1$, and if $Vin > Vth1, K \rightarrow \infty \Rightarrow Ceao \rightarrow 1 \times C1$, wherein Imax represents a maximum current value, Ceao represents the equivalent capacitance of the capacitor C1, K represents a coefficient, and Vth1 represents the voltage threshold.

In summary, the present disclosure provides the compensation circuit of realizing the equivalent capacitance amplification. Therefore, only the capacitor having the small capacitance needs to be included in the compensation circuit of the present disclosure, thereby saving cost and an area occupied by the capacitor. Under this condition, the effect realized by the large capacitance of the capacitor having the large size is still achieved by the compensation circuit of the present disclosure. In some applications, by the compensation circuit of the present disclosure, the equivalent amplification effect of the capacitance of the capacitor is attenuated for reducing the equivalent capacitance of the capacitor, such that the response speed of the capacitor is increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A compensation circuit of realizing equivalent capacitance amplification, comprising:
   an error amplifier, wherein a first input terminal of the error amplifier is coupled with a reference voltage, and a second input terminal of the error amplifier is coupled with a feedback voltage;
   a resistor, wherein a first terminal of the resistor is connected to a first output terminal of the error amplifier, and a second terminal of the resistor is connected to a second output terminal of the error amplifier; and
   a capacitor, wherein a first terminal of the capacitor is connected to the second terminal of the resistor, and a second terminal of the capacitor is grounded;
   wherein an amplified error current signal outputted from the first output terminal of the error amplifier flows through the resistor and is then divided into a capacitor charging signal and an error amplified reverse current signal, the capacitor charging signal flows to the capacitor, and the error amplified reverse current signal flows through the second output terminal of the error amplifier into the error amplifier;
   wherein the error amplified reverse current signal is larger than the capacitor charging signal.

2. The compensation circuit according to claim 1, wherein an error amplifier circuit inside the error amplifier includes:
- a first voltage input circuit, wherein two input terminals of the first voltage input circuit are used as the first input terminal and the second input terminal of the error amplifier, respectively, and the first voltage input circuit outputs an input error signal according to the feedback voltage and the reference voltage;
- a first amplified error output circuit, wherein one of a plurality of input terminals of the first amplified error output circuit is coupled with a common voltage, another of the plurality of input terminals of the first amplified error output circuit is connected to an output terminal of the first voltage input circuit, an output terminal of the first amplified error output circuit is used as the first output terminal of the error amplifier, the first amplified error output circuit amplifies the input error signal by N times to output the amplified error current signal, and N is an integer value being larger than 1; and
- a second amplified error output circuit, wherein an input terminal of the second amplified error output circuit is connected to the output terminal of the first voltage input circuit, an output terminal of the second amplified error output circuit is used as the second output terminal of the error amplifier, and the second amplified error output circuit amplifies the input error signal by (N−1) times to output the error amplified reverse current signal.

3. The compensation circuit according to claim 2, wherein the first voltage input circuit includes:
- a first transistor, wherein a first terminal of the first transistor is coupled with the common voltage, and a control terminal of the first transistor is used as the first input terminal of the error amplifier and coupled with the reference voltage;
- a second transistor, wherein a first terminal of the second transistor is coupled with the common voltage, and a control terminal of the second transistor is used as the second input terminal of the error amplifier and coupled with the feedback voltage;
- a third transistor, wherein a first terminal of the third transistor is connected to a second terminal of the first transistor and a control terminal of the third transistor, and a second terminal of the third transistor is grounded; and
- a fourth transistor, wherein a first terminal of the fourth transistor is connected to a control terminal of the fourth transistor and a second terminal of the second transistor, and a second terminal of the fourth transistor is grounded.

4. The compensation circuit according to claim 3, wherein the first voltage input circuit further includes:
- a first current source, wherein an input terminal of the first current source is coupled with the common voltage, and an output terminal of the first current source is connected to the first terminal of the first transistor and the first terminal of the second transistor.

5. The compensation circuit according to claim 4, wherein the first amplified error output circuit includes:
- a fifth transistor, wherein a first terminal of the fifth transistor is coupled with the common voltage;
- a sixth transistor, wherein a first terminal of the sixth transistor is coupled with the common voltage, and a control terminal of the sixth transistor is connected to a control terminal and a second terminal of the fifth transistor;
- a seventh transistor, wherein a first terminal of the seventh transistor is connected to the second terminal of the fifth transistor, a control terminal of the seventh transistor is connected to the control terminal and the first terminal of the fourth transistor, and a second terminal of the seventh transistor is grounded; and
- an eighth transistor, wherein a first terminal of the eighth transistor is connected to a second terminal of the sixth transistor, a control terminal of the eighth transistor is connected to the control terminal of the third transistor, a second terminal of the eighth transistor is grounded, and a node between the first terminal of the eighth transistor and the second terminal of the sixth transistor is used as the first output terminal of the error amplifier.

6. The compensation circuit according to claim 5, wherein the second amplified error output circuit includes:
- a ninth transistor, wherein a first terminal of the ninth transistor is coupled with the common voltage;
- a tenth transistor, wherein a first terminal of the tenth transistor is coupled with the common voltage, and a control terminal of the tenth transistor is connected to a control terminal and a second terminal of the ninth transistor;
- an eleventh transistor, wherein a first terminal of the eleventh transistor is connected to the second terminal of the ninth transistor, a second terminal of the eleventh transistor is grounded, and a control terminal of the eleventh transistor is connected to the first terminal of the third transistor; and
- a twelfth transistor, wherein a first terminal of the twelfth transistor is connected to a second terminal of the tenth transistor, a second terminal of the twelfth transistor is grounded, a control terminal of the twelfth transistor is connected to the first terminal of the fourth transistor, and a node between the first terminal of the twelfth transistor and the second terminal of the tenth transistor is used as the second output terminal of the error amplifier.

7. The compensation circuit according to claim 6, wherein the error amplifier circuit inside the error amplifier further includes:
- a second voltage input circuit connected to the control terminal of the eleventh transistor, wherein the second voltage input circuit controls the eleventh transistor such that the error amplified reverse current signal that flows through the second output terminal of the error amplifier into the error amplifier is limited.

8. The compensation circuit according to claim 7, wherein the second voltage input circuit includes:
- a second current source, wherein an input terminal of the second current source is coupled with the common voltage;
- a thirteenth transistor, wherein a first terminal of the thirteenth transistor is connected to an output terminal of the second current source, and a control terminal of the thirteenth transistor is coupled with the feedback voltage;
- a fourteenth transistor, wherein a first terminal of the fourteenth transistor is connected to the output terminal of the second current source, and a control terminal of the fourteenth transistor is coupled with the reference voltage;
- a fifteenth transistor, wherein a first terminal of the fifteenth transistor is connected to a second terminal of the fourteenth transistor, and a second terminal of the fifteenth transistor is grounded;

a sixteenth transistor, wherein a first terminal of the sixteenth transistor is connected to a second terminal of the thirteenth transistor, a second terminal of the sixteenth transistor is grounded, and a control terminal of the sixteenth transistor is connected to the first terminal of the sixteenth transistor, a control terminal of the fifteenth transistor and the control terminal of the twelfth transistor;

a seventeenth transistor, wherein a first terminal of the seventeenth transistor is connected to the second terminal of the fourteenth transistor and a control terminal of the seventeenth transistor, and a second terminal of the seventeenth transistor is grounded; and an eighteenth transistor, wherein a first terminal of the eighteenth transistor is connected to the second terminal of the thirteenth transistor, a control terminal of the eighteenth transistor is connected to the control terminal of the seventeenth transistor and the control terminal of the eleventh transistor, and a second terminal of the eighteenth transistor is grounded.

9. The compensation circuit according to claim 8, wherein a current outputted from the output terminal of the second current source is smaller than a current outputted from the output terminal of the first current source.

\* \* \* \* \*